United States Patent [19]
Burghartz et al.

[11] Patent Number: 5,656,849
[45] Date of Patent: Aug. 12, 1997

[54] TWO-LEVEL SPIRAL INDUCTOR STRUCTURE HAVING A HIGH INDUCTANCE TO AREA RATIO

[75] Inventors: Joachim Norbert Burghartz, Shrub Oak; Keith Aelwyn Jenkins, Tarrytown; Saila Ponnapalli, Fishkill; Mehmet Soyuer, Yorktown Heights, all of N.Y.

[73] Assignee: International Business Machines Corporation, Armonk, N.Y.

[21] Appl. No.: 594,455

[22] Filed: Jan. 31, 1996

Related U.S. Application Data

[60] Provisional application No. 60/004,188, Sep. 22, 1995.
[51] Int. Cl.$^6$ .................................................. H01L 29/00
[52] U.S. Cl. ........................... 257/528; 257/531; 336/185; 336/208; 336/220
[58] Field of Search ................................ 257/528, 531

[56] References Cited

U.S. PATENT DOCUMENTS

| | | |
|---|---|---|
| 4,418,470 | 12/1983 | Naster et al. . |
| 4,494,100 | 1/1985 | Stengel et al. ............... 257/531 |
| 4,648,087 | 3/1987 | Scranton et al. . |
| 5,070,317 | 12/1991 | Bhagat . |
| 5,095,357 | 3/1992 | Andoh et al. . |
| 5,227,659 | 7/1993 | Hubbard . |
| 5,279,988 | 1/1994 | Saadat et al. . |

*Primary Examiner*—Edward Wojciechowicz
*Attorney, Agent, or Firm*—Whitham, Curtis, Whitham & McGinn; Robert P. Tassinari, Jr.

[57] ABSTRACT

A high-Q monolithic inductor structure formed using conventional silicon technology and having a first complete lower inductor spiral formed on a substrate and a second complete upper formed on a insulating layer over the first inductor spiral. Central portions of the inductor spirals are connected through a via hole in the insulating layer. The inductor spirals are oriented such that the current flows in the first and second spirals are in the same direction.

5 Claims, 1 Drawing Sheet

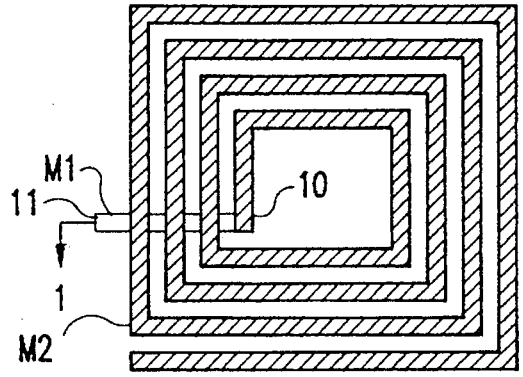
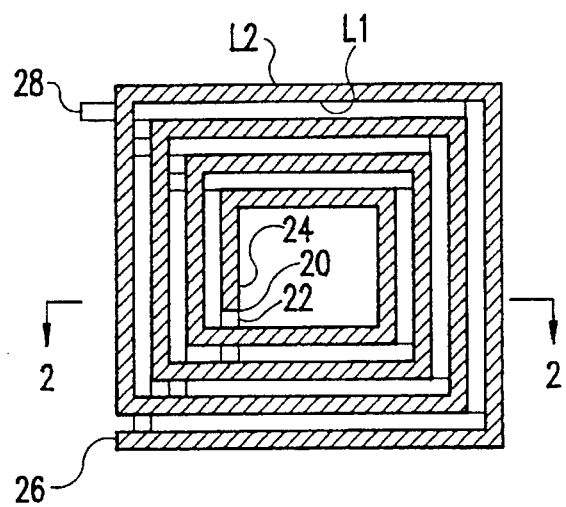
FIG.1A
FIG.2A
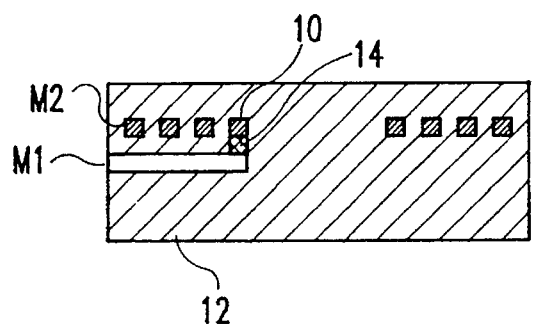
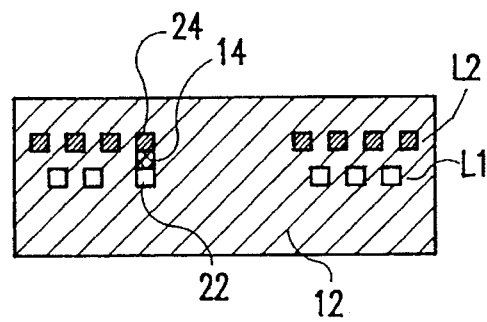
FIG.1B
FIG.2B

TWO-LEVEL SPIRAL INDUCTOR STRUCTURE HAVING A HIGH INDUCTANCE TO AREA RATIO

CROSS-REFERENCE TO RELATED APPLICATIONS

The present application claims priority to co-pending U.S. Provisional application Ser. No. 60/004,188 filed Sep. 22, 1995.

BACKGROUND OF THE INVENTION

1. Field of the Invention

The present invention generally relates to monolithic integrated circuits, and, more particularly, to a spiral inductor having two stacked inductor spirals with the same direction of current flow.

2. Description of the Prior Art

Many digital and analog circuits, including complex microprocessors and operational amplifiers, have been successfully implemented in silicon based integrated circuits (ICs). These circuits typically include active devices such as bipolar transistors and field effect transistors (FETs), diodes of various types, and passive devices such as resistors and capacitors.

Attempts to miniaturize radio frequency (RF) circuits, however, remain a challenge. RF circuits are used in cellular phones, wireless modems, and other types of communication equipment. The miniaturization problem arises due to the difficulty in producing a good conductor in silicon technologies which is suitable for RF applications at widely used microwave frequencies from 900 MHz to 2.4 GHz.

Monolithic microwave integrated circuits (MMICs) are rapidly outpacing discrete integrated circuits in mobile wireless communications products, as described in R. Schneiderman, "Who's winning the wireless war?", Microwave & RF, October 1994, pp. 31-36. MMICs require high-Q passive components, such as inductors and capacitors, to be able to realize integrated filters and matching sections with small insertion losses.

If conventional silicon technology is used, e.g., BiCMOS, the inductor is clearly the performance and density limiting passive element. While the Q of an integrated inductor can be improved by modifying the interconnect technology by switching from AlCu to Cu or Au interconnects, the area consumption of the inductor structure is difficult to reduce. For example, a single inductor of 2 nH inductance would encompass an area of approximately 250×250 μm².

It is well known that the direct current (DC) resistance of a metal line that forms a spiral inductor is a major contributor to the inductor Q degradation. One way to reduce this effect is to use wide metal line widths. However, this increases the inductor area and the parasitic capacitance associated with the structure. The larger inductor area limits the miniaturization that can be achieved, and the parasitic capacitance associated with the larger area decreases the self-resonance frequency of the inductor, thereby limiting its useful frequency range.

Further, since the Q is directly proportional to the frequency and inversely proportional to the series loss of the inductor, the metal line widths cannot be chosen arbitrarily.

Attempts to integrate inductors into silicon technologies have yielded either inductor Q values of less than five or required special metalization layers such as gold.

A standard feature in present day very large scale integration (VLSI) is the use of multi-level interconnects for inductor integration. Using this technology in an effort to provide a high-Q circuit, some have shunted several layers of metal together to "simulate" a thicker metal layer than achievable in AlCu interconnect technology. See U.S. Pat. No. 5,446,311 to Soyuer et al., issued Aug. 29, 1995 (assigned to IBM). With Q values above five, such shunted inductors represented an improvement over the prior art. Efforts continue, however, to manufacture inductors with even higher Q values.

In light of the foregoing, there exists a need for monolithic inductor structure having Q values well in excess of five that can be integrated at radio and microwave frequencies.

SUMMARY OF THE INVENTION

The present invention is directed to a high-Q monolithic inductor structure, which substantially obviates one or more of the problems due to the limitations and disadvantages of the related art.

In accordance with this invention, two spaced apart inductor spirals are connected through a metalized via hole. The inductor spirals are oriented such that the direction of current flow is identical in both, thereby providing about two to four times the inductance than that of a conventional inductor for the same area.

To achieve these and other advantages and in accordance with the purpose of the invention, as embodied and broadly described, the invention provides for a high-Q monolithic inductor structure formed using conventional silicon technology, comprising a first inductor spiral formed on a substrate; a second inductor spiral formed on a insulating layer over the first inductor spiral; and a central terminal portion of the first inductor spiral being connected to a central terminal portion of the second inductor spiral through a via hole in the insulating layer, whereby current flows in the first and second inductor spirals are in the same direction.

It is to be understood that both the foregoing general description and the following detailed description am exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a plan view of a conventional spiral inductor;

FIG. 1B is a cross section of the spiral inductor of FIG. 1A taken along the line 1—1;

FIG. 2A is a plan view of a multi-level spiral inductor in accordance with the present invention; and FIG. 2B is a cross section of the spiral inductor of FIG. 2A taken along the line 2—2.

DETAILED DESCRIPTION OF THE INVENTION

Referring now to the drawings, and more particularly to FIGS. 1A and 1B, there is shown respective plan and side cross-sectional views of a conventional spiral inductor. The first, lower partial metal layer M1 on substrate 12 is used as a cross-under to connect the central terminal 10 of the upper, second metal layer M2 to the outside at terminal portion 11. Note that the upper metal layer M2 in FIG. 1A is a complete inductor spiral.

Using multi-level interconnect technology, however, one could use a complete inductor spiral to replace the partial metal layer M1 to provide the pass-connection to the outside.

Referring again to the drawings, and more particularly to FIGS. 2A and 2B, there is formed a spiral inductor L1 at the lower metal level that replaces the straight underpass M1 as in FIG. 1A. In this way the inner contact at connection point 20 to the upper spiral L2 is not only brought to the outside at termination point 28, but the lower spiral wire L1 provides additional magnetic flux and thus a significantly increased inductance.

It is important, however, that the direction of current flow in the lower spiral inductor L1 be identical to the direction of current flow in the upper spiral L2. This ensures that the flux components add and do not cancel each other.

In comparison to the conventional inductor structure of FIGS. 1A and 1B, the new structure provides about two to four times the inductance for the same area, or the same inductance in about one-fourth to one-half the conventional area.

The horizontal spacing between adjacent inductors on a substrate can be small because the magnetic field decays according to the formula $(1/d)^7$, with "d" being the center-to-center distance between the two adjacent inductors on a chip. See G. E. Howard, J. Dai, Y. L. Chow, & M. G. Stubbs, "The Power Transfer Mechanism of MMIC Spiral Transformers and Adjacent Spiral Inductors", IEEE MTT-Digest, pp. 1251–1254, 1989.

The new inductor structure can be fabricated by using standard silicon multi-level interconnect technology. The fabrication process is similar to that described in U.S. Pat. No. 5,446,311 described earlier. It requires 2 n metal layers with "n" being the number of interconnect levels.

Basically, each of the individual spiral inductors may be composed of several metal layers that are shunted or connected in parallel to realize a "thicker" metal layer. The metal layers are identical spiral metal patterns and each is covered with silicon dioxide through which individual vias (not shown) are formed. The vias are filled with a metal to interconnect the metal layers to form the "thicker" lower and upper spiral inductors L1 and L2. The layers L1 and L2 are then connected through metalized via 14 at connection point 20 as shown in FIGS. 2A and 2B.

The advantage of the new two-spiral inductor has been verified by comparing it to a conventional spiral inductor. The novel structure tested utilized an AlCu interconnect scheme with 2.16 μm metal thickness, 1.5 μm oxide isolation between metal levels, 4.5 μm spacing between the lower metal layer and the 10 ohm-cm silicon substrate, and with a total area of 226×226 μm². Tables 1 and 2 below summarize the resulting inductance (L) and Q values at 900 MHz and 1.8 GHz, respectively:

TABLE 1

| Inductance and Q Values at 900 MHz | | |
|---|---|---|
| 900 MHz | Overlap | No Overlap |
| L | 8.0 nH | 7.7 nH |
| Q | 7.0 | 6.6 |

TABLE 2

| Inductance and Q Values at 1.8 GHz | | |
|---|---|---|
| 1.8 GHz | Overlap | No Overlap |
| L | 8.3 nH | 7.9 nH |
| Q | 9.1 | 8.0 |

"No Overlap" refers to an orientation such as that shown in FIGS. 2A and 2B where the upper L2 and lower L1 spirals do not significantly overlap, while "Overlap" signifies that the upper and lower spirals substantially overlap.

For comparison, at 900 MHz, a conventional structure of the same area having an upper spiral layer and a straight cross-under-such as that shown in FIG. 1A—had an inductance of 2.6 nH and a Q of 5.6. The inductance for the "overlap" condition was thus at least three times greater than the conventional structure. The Q value was also 25% higher.

At 1.8 GHz, the conventional structure of the same area had an inductance of 2.6 nH and a Q of 10.6. While the Q of the "overlap" condition was somewhat lower than the conventional structure, note that the inductance was at least three times greater than the conventional structure.

The results therefore confirm the overall improvement of the two-level spiral over the conventional structure. The use of this novel two-level inductor in place of the conventional structure allows a significantly increased integration density for MMICs.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A high-Q monolithic inductor structure for microwave applications fabricated using conventional silicon integrated circuit technology, comprising:

a first inductor spiral formed on a substrate;

an insulating layer formed over the first inductor spiral;

a second inductor spiral formed on the insulating layer over said first inductor spiral and positioned to achieve a parasitic capacitance between the first and second inductor spirals that produces a self-resonance frequency of the inductor within a useful microwave frequency range; and a central terminal portion of the first inductor spiral being connected to a central terminal portion of the second inductor spiral through a via hole in the insulating layer, whereby current flows in the first and second inductor spirals are in the same direction.

2. A structure as in claim 1, wherein the insulating layer is silicon dioxide.

3. A structure as in claim 2, wherein said inductor structure has a Q value of about seven or more at a 900 MHz to 1.8 GHz band.

4. A structure as in claim 3, wherein the second inductor spiral is oriented to substantially overlap said first inductor spiral.

5. A structure as in claim 3, wherein the second inductor spiral is oriented to be non-overlapped with said first inductor spiral.

* * * * *